(12) United States Patent
Ikumo et al.

(10) Patent No.: US 6,437,432 B2
(45) Date of Patent: Aug. 20, 2002

(54) SEMICONDUCTOR DEVICE HAVING IMPROVED ELECTRICAL CHARACTERISTICS AND METHOD OF PRODUCING THE SAME

(75) Inventors: Masamitsu Ikumo; Toshimi Kawahara; Norio Fukasawa, all of Kawasaki; Kenichi Nagashige, Yokohama, all of (JP)

(73) Assignee: Fujitsu Limited, Kawasaki (JP)

( * ) Notice: Subject to any disclaimer, the term of this patent is extended or adjusted under 35 U.S.C. 154(b) by 42 days.

(21) Appl. No.: 09/745,742

(22) Filed: Dec. 26, 2000

(30) Foreign Application Priority Data

Mar. 21, 2000 (JP) ........................................ 2000-078935

(51) Int. Cl.⁷ .............................................. H01L 23/52
(52) U.S. Cl. ........................ 257/691; 257/758; 438/622
(58) Field of Search ................................ 257/691, 758, 257/664, 750, 776; 438/19, 125, 622, 652, 666

(56) References Cited

U.S. PATENT DOCUMENTS

| 5,046,161 | A | * | 9/1991 | Takada |
| 5,117,276 | A | * | 5/1992 | Thoma et al. |
| 5,604,379 | A | * | 2/1997 | Mori |
| 5,677,576 | A | * | 10/1997 | Akagawa |
| 5,834,844 | A | * | 11/1998 | Akagawa et al. |
| 6,326,699 | B2 | * | 12/2001 | Shimizu et al. |

* cited by examiner

Primary Examiner—Sheila V. Clark
(74) Attorney, Agent, or Firm—Armstrong, Westerman & Hattori, LLP

(57) ABSTRACT

A semiconductor device is provided, which device includes a semiconductor substrate including a plurality of signal pads and ground pads, an insulating film formed on the semiconductor substrate, a conductive metal film formed on the insulating film and electrically connected to the ground pads and a plurality of first interconnection lines electrically connected to the signal pads and insulated from the conductive metal film. The conductive metal film is formed over a region including the first interconnection lines in a plan view of the semiconductor device.

17 Claims, 14 Drawing Sheets

20C

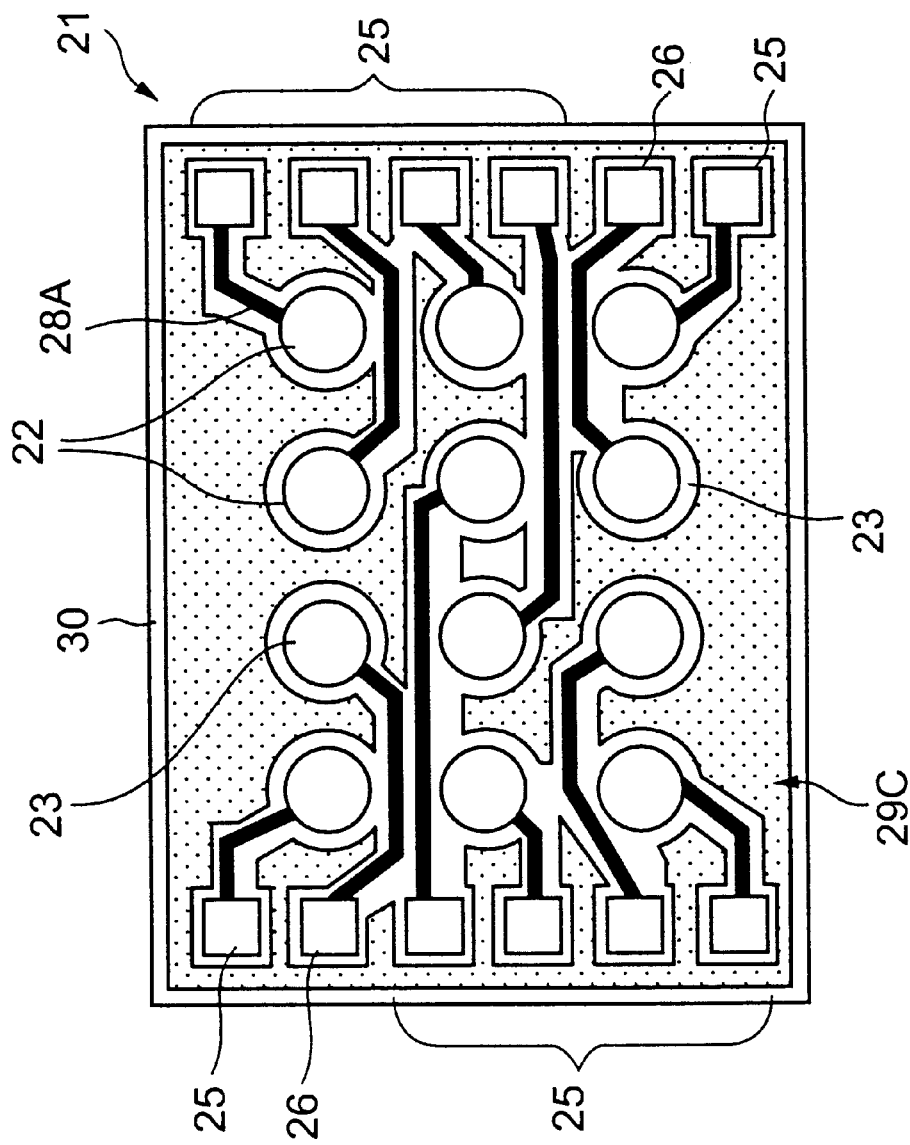

SEMICONDUCTOR DEVICE HAVING IMPROVED ELECTRICAL CHARACTERISTICS AND METHOD OF PRODUCING THE SAME

BACKGROUND OF THE INVENTION

1. Field of the Invention

The present invention generally relates to semiconductor devices and methods of producing the same, and more particularly to a semiconductor device having a chip size package (CSP) structure and a method of producing the same.

Recently, attempts have been made to produce a smaller size semiconductor device having a higher density in order to meet a demand for a smaller electronic device and apparatus. Proposed as such a smaller size semiconductor device is a semiconductor device having a so-called CSP structure, which is downsized by being shaped as close to a semiconductor element (chip) as possible.

A downsized high-density semiconductor device with an increased number of pins requires pitches between its external connection terminals to be narrowed. Therefore, a protrusion electrode (bump) is employed as an external connection terminal so that a relatively large number of external connection electrodes can be formed in a reduced space.

2. Description of the Related Art

FIGS. 1 and 2 show a conventional semiconductor device 10. FIG. 1 is a sectional view of the semiconductor device 10 and FIG. 2 is a plan view of the semiconductor device 10 without a sealing resin 14. The semiconductor device 10 is downsized by being formed to have the CSP structure. The semiconductor device 10 includes a semiconductor substrate 11 in a chip state, interconnection lines 18, protrusion electrodes for signal (hereinafter, protrusion signal electrodes) 12, protrusion electrodes for ground (hereinafter, protrusion ground electrodes) 13 and the sealing resin 14.

The upper surface of the semiconductor substrate 11 in FIG. 1 is a circuit-containing surface on which a circuit including pads for signal (hereinafter, signal pads) 15 and pads for ground (hereinafter, ground pads) 16 is formed. An insulating film is formed on the circuit-containing surface except for the positions where the signal and ground pads 15 and 16 are formed. The insulating film provides protection for the circuit-containing surface.

The interconnection lines 18 are formed directly on the upper surface of the insulating film 17 in a predetermined pattern. One end portion of each of the interconnection lines 18 is connected to one of the signal pads 15 or the ground pads 16, while one of the protrusion signal electrodes 12 or the protrusion ground electrodes 13 is formed on the other end portion of each of the interconnection lines 18. The protrusion signal and ground electrodes 12 and 13 serve as the external connection terminals of the semiconductor device 10.

Further, the sealing resin 14 is formed to cover the circuit-containing surface of the semiconductor substrate 11 so as to protect the insulating film 17, the interconnection lines 18, and the protrusion signal and ground electrodes 12 and 13. However, the upper end surfaces of the protrusion signal and ground electrodes 12 and 13 are uncovered and appear from the sealing resin 14.

As described above, the semiconductor device 10 having the conventional CSP structure has the interconnection lines 18 formed on the insulating film 17 so as to electrically connect the signal and ground pads 15 and 16 and the corresponding protrusion signal and ground electrodes 12 and 13. The interconnection lines 18 serve as interposers, thus allowing the signal and ground pads 15 and 16 to be formed at a distance from the protrusion signal and ground electrodes 12 and 13. This gives more latitude in determining where to dispose the protruding signal and ground electrodes 12 and 13, and also allows the semiconductor device 10 to accommodate an increased number of pins.

However, according to the conventional semiconductor device 10, the interconnection lines 18 serving as the interposers each have a single-layer structure, thus restricting the layout of the interconnection lines 18. Therefore, a layout of the interconnection lines 18 considering an electrical characteristic is prevented from being formed. In other words, the semiconductor device 10 having the conventional CSP structure is downsized to have only a limited region for forming the interconnection lines 18. Forming a large number of the interconnection lines 18 in the region would require each of the interconnection lines 18 to have a narrower line width, thus causing the impedance of each of the interconnection lines 18 to become higher.

On the other hand, a high-frequency clock has been employed in the semiconductor substrate 11 to meet a demand for a higher processing speed. Therefore, a signal input to or output from each of the signal pads 15 via a corresponding one of the interconnection lines 18 becomes a high-frequency signal, which may generate interference between adjacent two of the interconnection lines 18. Thus, the restriction on the layout of the interconnection lines 18 prevents the semiconductor device 10 having the conventional CSP structure from realizing the higher processing speed.

SUMMARY OF THE INVENTION

It is a general object of the present invention to provide a semiconductor device in which the above disadvantages are eliminated and a method of producing the same.

A more specific object of the present invention is to provide a semiconductor device having an improved electrical characteristic and a method of producing the same.

The above objects of the present invention are achieved by a semiconductor device including a semiconductor substrate including a plurality of signal pads and ground pads, an insulating film formed on the semiconductor substrate, a conductive metal film formed on the insulating film and electrically connected to the ground pads and a plurality of first interconnection lines electrically connected to the signal pads and insulated from the conductive metal film, wherein the conductive metal film is formed over a region including the first interconnection lines in a plan view of the semiconductor device.

According to the above-described semiconductor device, since the conductive metal film is formed to be electrically connected to the ground pads, the conductive metal film can be employed as a ground layer having a ground potential. Further, the conductive metal film is formed over the region including the interconnection lines in the plan view of the semiconductor device. Therefore, the conductive metal film can be formed over a wide area without being restricted by the positions of the interconnection lines.

As is known, an electrical resistance is inversely proportional to the cross-sectional area of a conductive material. Therefore, the wide formation area of the conductive metal film, that is, the wide cross-sectional area of a ground, lowers a ground impedance. As a result, the semiconductor device is provided with an improved electrical characteristic so as to become a fast semiconductor device employing a high frequency. Since the conductive metal film is electrically insulated from the interconnection lines, the conductive metal film does not cause a short circuit between the interconnection lines and the ground.

The above objects of the present invention are also achieved by a semiconductor device including a semiconductor substrate including a plurality of signal pads and ground pads, an insulating film formed on the semiconductor substrate, a conductive metal film electrically connected to the ground pads, a plurality of first interconnection lines electrically connected to the signal pads and insulated from the conductive metal film and a plurality of metal films electrically connected to the first interconnection lines and insulated from the conductive metal film, wherein the conductive metal film is formed over a region including the first interconnection lines in a plan view of the semiconductor device.

The above objects of the present invention are also achieved by a semiconductor device including a semiconductor substrate including a plurality of signal pads and ground pads, an insulating film formed on the semiconductor substrate, a first conductive metal film formed on the insulating film and electrically connected to the ground pads, a second conductive metal film electrically connected to and formed on the first conductive metal film, and a plurality of interconnection lines electrically connected to the signal pads and insulated from the first and second conductive metal films, wherein the first and second conductive metal films are formed over a region including the interconnection lines in a plan view of the semiconductor device.

The above objects of the present invention are further achieved by a method of producing a semiconductor device comprising the steps of (a) forming a first insulating film on a semiconductor substrate including signal and ground pads except for positions where the signal and ground pads are formed, (b) forming a conductive metal film on the first insulating film except for the positions where the signal pads are formed, (c) forming a second insulating film over the conductive metal film, (d) forming interconnection lines on the second insulating film, (e) forming protrusion electrodes each having a predetermined height on the interconnection lines and (f) providing resin sealing on the first and second insulating films, the conductive metal film, the interconnection lines and sides of the protrusion electrodes.

BRIEF DESCRIPTION OF THE DRAWINGS

Other objects, features and advantages of the present invention will become more apparent from the following detailed description when read in conjunction with the accompanying drawings, in which:

FIG. 14 is a plan view of a semiconductor device according to a sixth embodiment of the present invention.

DETAILED DESCRIPTION OF THE PREFERRED EMBODIMENTS

Next, a description will be given of embodiments of the present invention with reference to the accompanying drawings.

Figure 1:
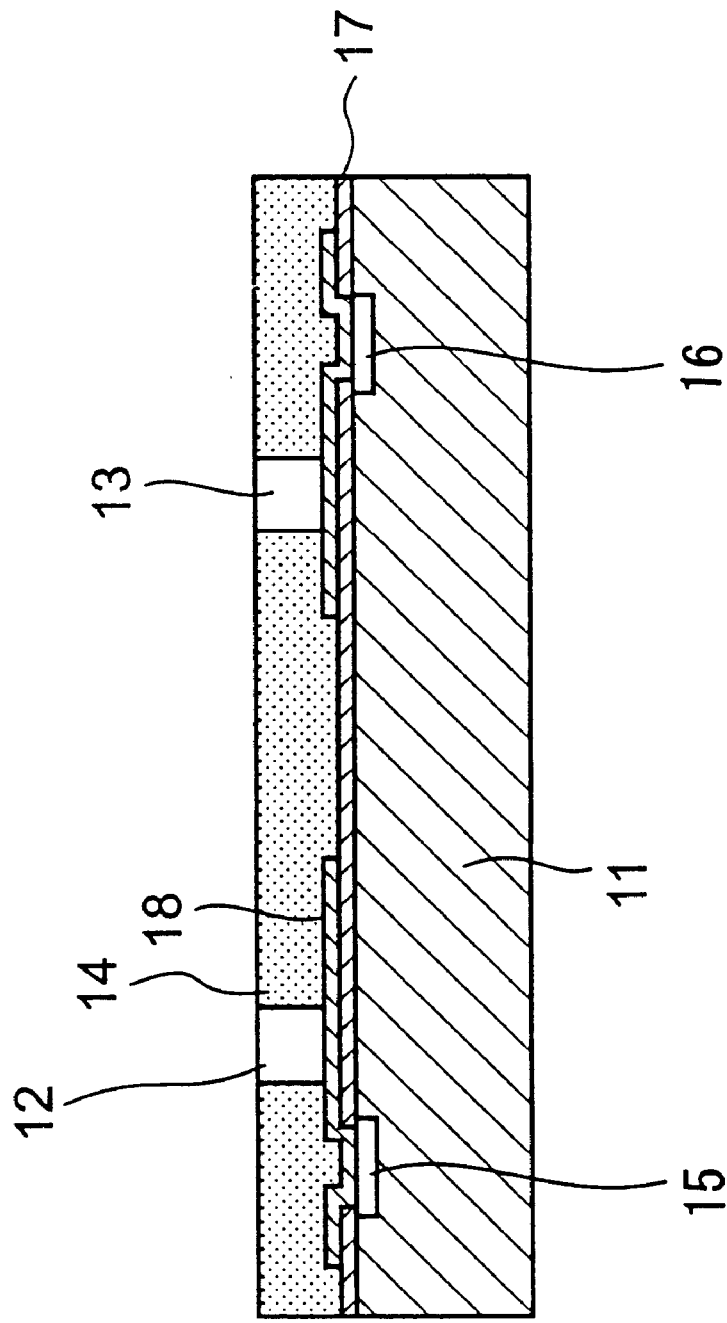
FIG. 1 is a sectional view of a conventional semiconductor device.
Figure 2:
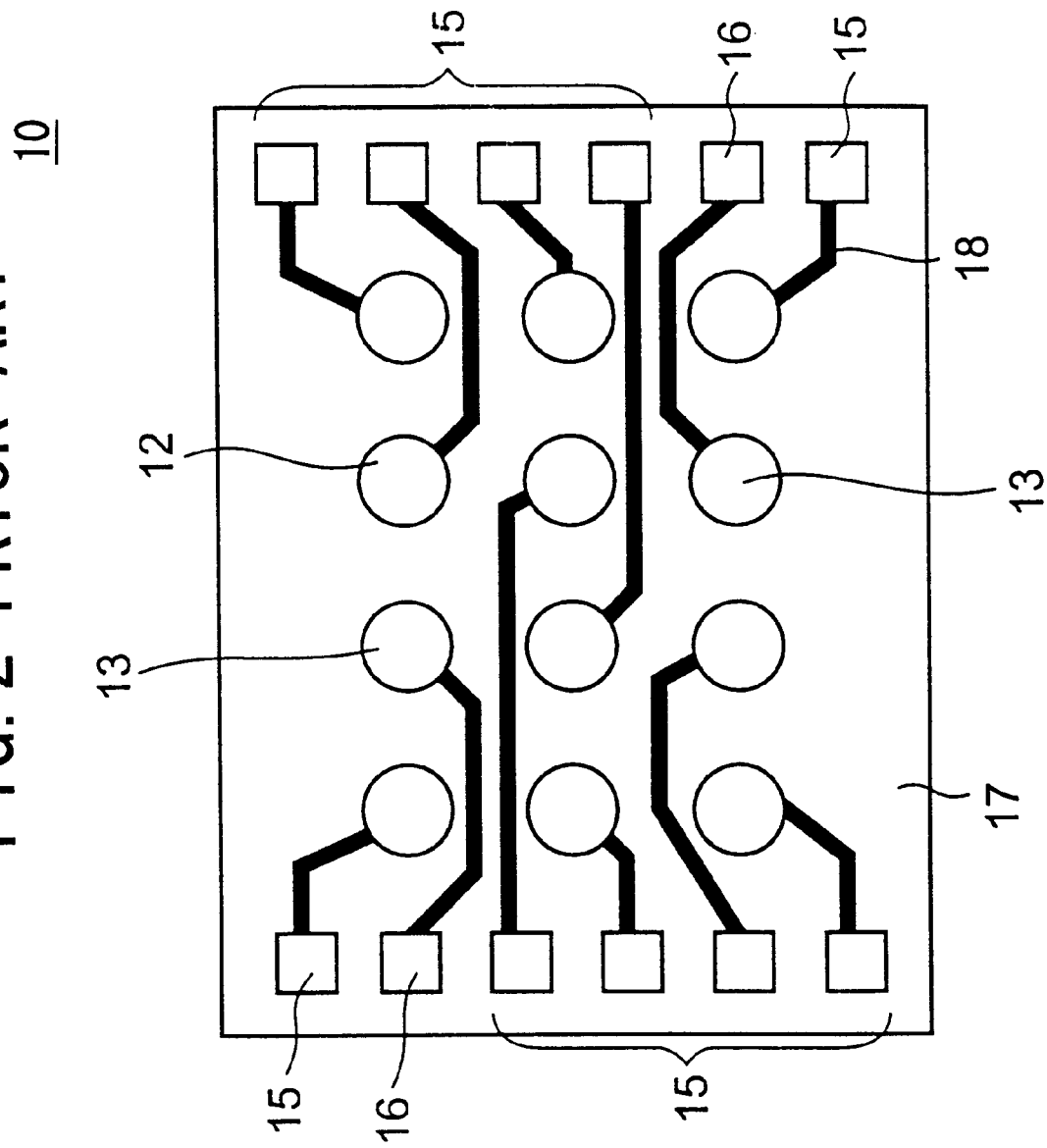
FIG. 2 is a plan view of the conventional semiconductor device of FIG. 1 without a sealing resin.
Figure 3:
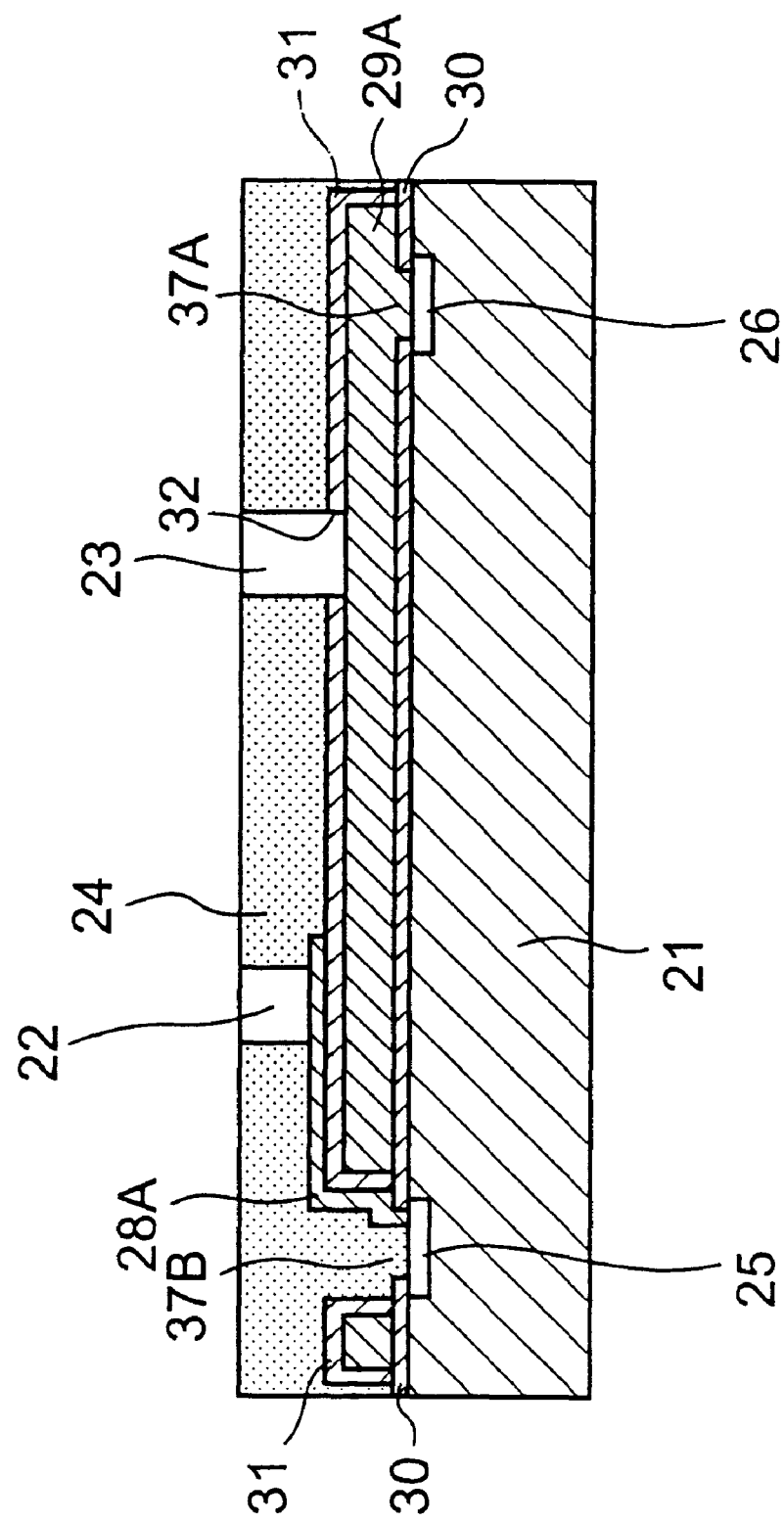
FIG. 3 is a sectional view of a semiconductor device according to a first embodiment of the present invention.

FIG. 3 is a sectional view of a semiconductor device 20A according to a first embodiment of the present invention. The semiconductor device 20A includes a semiconductor substrate (semiconductor chip) 21, protrusion signal electrodes 22 and protrusion ground electrodes 23, a sealing resin 24, interconnection lines 28A, a metal film (conductive metal film) 29A and first and second insulating films 30 and 31. The semiconductor device 20A is downsized by being formed to have a CSP structure so that the semiconductor substrate 21 is approximately equal to the sealing resin 24 in size in a plan view of the semiconductor device 20A.

The semiconductor substrate 21 is formed by forming an electronic circuit on a semiconductor substrate such as a silicon substrate. The circuit is formed on the upper surface of the semiconductor substrate 21 in FIG. 3. The upper surface is hereinafter referred to as a circuit-containing surface. Signal pads 25 and ground pads 26 are formed on the circuit-containing surface of the semiconductor substrate 21. The signal pads 25 and ground pads 26 are made, for example, of aluminum.

Besides the above-described signal and ground pads 25 and 26, the semiconductor substrate 21 has other pads including a pad for power supply (hereinafter, a power supply pad). However, in this embodiment, only the above-described signal and ground pads 25 and 26 are shown in the drawings, and graphical representations of the other pads are omitted.

The semiconductor substrate 21 having the above-described structure has the first insulating film 30 formed on its circuit-containing surface. The first insulating film 30, for example, includes a resin of a polyimide family having a high electrical insulation. Further, the first insulating film 30 does not cover the positions where the above-described signal and ground pads 25 and 26 are formed so as to have opening portions 37B over the positions where the signal pads 25 are formed and opening portions 37A over the positions where the ground pads 26 are formed. The first insulating film 30 of the above-described structure has a main function of preventing a short circuit between the electronic circuit-containing on the semiconductor substrate 21 and the below-described metal film 29A. The first insulating film 30 has an approximate thickness of 10 µm.

The metal film 29A is formed on the upper surface of the first insulating film 30 having the above-described structure. The metal film 29A is made of a metallic material having low electrical resistance such as copper (Cu) or aluminum (Al). The thickness of the metal film 29A ranges from 20 to 30 µm, and is thicker than the respective thicknesses of the above-described first insulating film 30, the below-described interconnection lines 28A and second insulating film 31. Each of the latter thicknesses is approximately 10 µm.

The metal film 29A is formed on almost the entire surface of the semiconductor substrate 21 except for the positions where the signal pads 25 are formed. Further, the metal film 29A is directly electrically connected to the ground pads 26 via the opening portions 37A formed in the first insulating film 30. By thus directly connecting the ground pads 26 and the metal film 29A, an impedance can be lowered in this structure compared with a structure employing interconnection lines or the like for ground connections.

The second insulating film 31 is formed over the metal film 29A having the above-described structure. The second insulating film 31, for example, includes a resin of the polyimide family having a high electrical insulation. The second insulating film 31 does not cover the positions where the signal pads 25 and the protrusion ground electrodes 23 are formed.

In other words, the second insulating film 31 has the opening portions 37B over the positions where the signal pads 25 are formed and openings 32 in the positions where the protrusion ground electrodes 23 are formed. The second insulating film 31 having the above-described structure has a main function of preventing a short circuit between the metal film 29A and the below-described interconnection lines 28A. As previously described, the second insulating film 31 has an approximate thickness of 10 µm.

The interconnection lines 28A are formed on the second insulating film 31 having the above-described structure. A first end portion of each of the interconnection lines 28A is connected to one of the signal pads 25, while one of the protrusion signal electrodes 22 is formed on a second end portion of each of the interconnection lines 28A. According to this embodiment, the interconnection lines 28A are provided only between the signal pads 25 and the protrusion signal electrodes 22. Each of the interconnection lines 28A is made of a material having low electrical resistance such as copper (Cu) or aluminum (Al), and has an approximate thickness of 10 µm.

The protrusion signal and ground electrodes 22 and 23 serve as the external connection terminals of the semiconductor device 20A. The protrusion signal electrodes 22, as described above, are formed on the interconnection lines 28A and connected to the signal pads 25 on the semiconductor substrate 21 via the interconnection lines 28A. The protrusion ground electrodes 23 are directly electrically connected to the metal film 29A via the openings 32 formed in the second insulating film 31.

According to the above-described structure, the protrusion ground electrodes 23 are electrically connected to the ground pads 26 via the metal film 29A. Since the protrusion ground electrodes 23 and the metal film 29A are directly electrically connected, an impedance is lowered in this structure. Further, the metal film 29A is formed thick, as previously described, so as to have a low impedance. Therefore, according to the structure of this embodiment, the whole circuit from the protrusion ground electrodes 23 to the ground pads 26 has a lowered impedance.

Furthermore, the sealing resin 24 is formed to cover the circuit-containing surface of the semiconductor substrate 21 so as to protect the second insulating film 31, the interconnection lines 28A and the protrusion signal and ground electrodes 22 and 23. However, the upper end surfaces of the protrusion signal and ground electrodes 22 and 23 are uncovered and appear from the sealing resin 24.

Examples of the sealing resin 24, which is shown stippled in FIG. 3, include thermoplastic or thermosetting resins such as polyimide, an epoxy resin, poly(phenylene sulfide) (PPS), poly(ether-ketone) (PEK), poly(ether-sulfone) (PES) and a heat-resistant liquid crystal resin. The sealing resin 24 is formed over the entire circuit-containing surface of the semiconductor substrate 21. Therefore, the interconnection lines 28, the metal film 29A, the first and second insulating films 30 and 31, and the protrusion signal and ground electrodes 22 and 23, each formed on the semiconductor substrate 21, are sealed by the sealing resin 24.

However, the sealing resin 24 seals only the sides of the protrusion signal and ground electrodes 22 and 23, so that the top end portions thereof appear from the sealing resin 24. In other words, the sealing resin 24 seals the protrusion signal and ground electrodes 22 and 23 except for their top end portions. This allows the semiconductor device 20A to be mounted on an external apparatus such as a mounting board by using the protrusion signal and ground electrodes 22 and 23.

As described above, according to the semiconductor device 20A of this embodiment, the metal film 29A is formed to be electrically connected to the protrusion ground electrodes 23 and the ground pads 26. Therefore, the metal film 29A has a ground potential and can be employed as a ground layer. Further, since the interconnection lines 28A are formed above the metal film 29A with the second insulating film 31 interposed therebetween, the metal film 29A, in the plan view of the semiconductor device 20A, is formed over a region including a plurality of the interconnection lines 28A. That is, the metal film 29A and the interconnection lines 28A have a layered structure. Therefore, the metal film 29A and the interconnection lines 28A can be formed without being restricted by each other's positions, thus allowing a wide formation area for each of the metal film 29A and the interconnection lines 28A.

As is known, an electrical resistance is inversely proportional to the cross-sectional area of a conductive material. Therefore, the wide formation areas of the metal film 29A and the interconnection lines 28A lower the ground impedance of the metal film 29A and the signal impedance of each of the interconnection lines 28A. As a result, the semiconductor device 20A is provided with an improved electrical characteristic so as to become a fast semiconductor device employing a high frequency.

As previously described, according to the semiconductor device 20A of this embodiment, the protrusion ground electrodes 23 are formed directly on the metal film 29A, which is directly connected to the ground pads 26. This structure requires no interconnection lines for ground to be provided so as to electrically connect the ground pads 26 and the protrusion ground electrodes 23, thus giving more latitude in a layout of interconnection lines.

Next, a description will be given, with reference to FIGS. 4 through 10, of a method of producing a semiconductor device according to a second embodiment of the present invention. The following description will be given by referring to the method of producing the semiconductor device 20A shown in FIG. 3.

The method of producing the semiconductor device 20A according to this embodiment includes the steps of forming a first insulating film, forming a conductive metal film, forming a second insulating film, forming interconnection lines, forming protrusion electrodes and providing resin sealing. In each of FIGS. 4 through 9, only a portion corresponding to one semiconductor device is shown for the convenience of graphical representation. However, the above-mentioned steps are performed on the semiconductor substrate 21 in a wafer state in the actual production process. The semiconductor device 20A is produced by dividing the wafer of the semiconductor substrate 21 into pieces by dicing after the above-mentioned steps are over. Now, a detailed description will be given of each of the above-mentioned steps.

Figure 4:
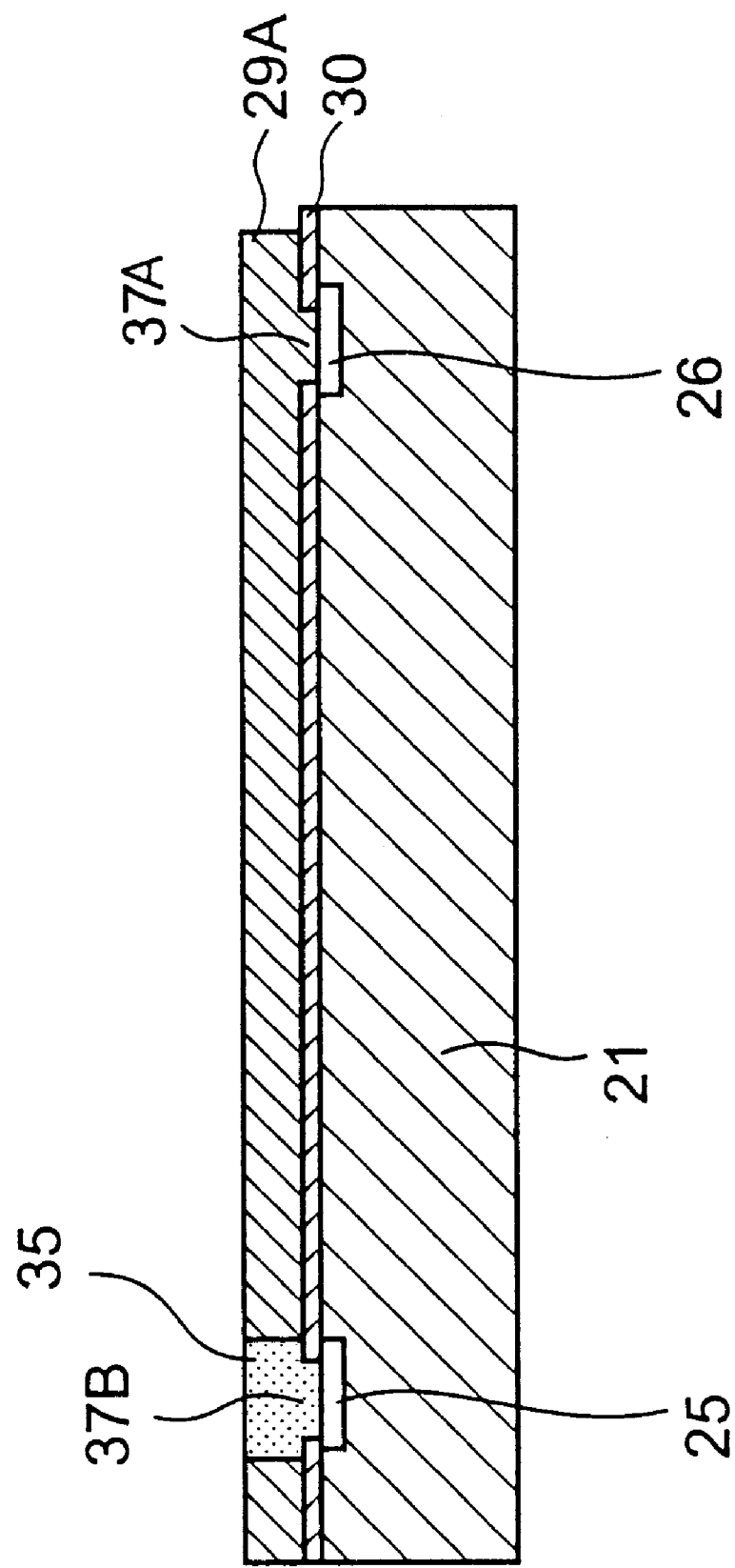
FIG. 4 is a sectional view of a semiconductor substrate of FIG. 5 taken along an A—A line for illustrating steps of forming a first insulating film and forming a conductive metal film, the steps being included in a method of producing a semiconductor device according to a second embodiment of the present invention.
Figure 5:
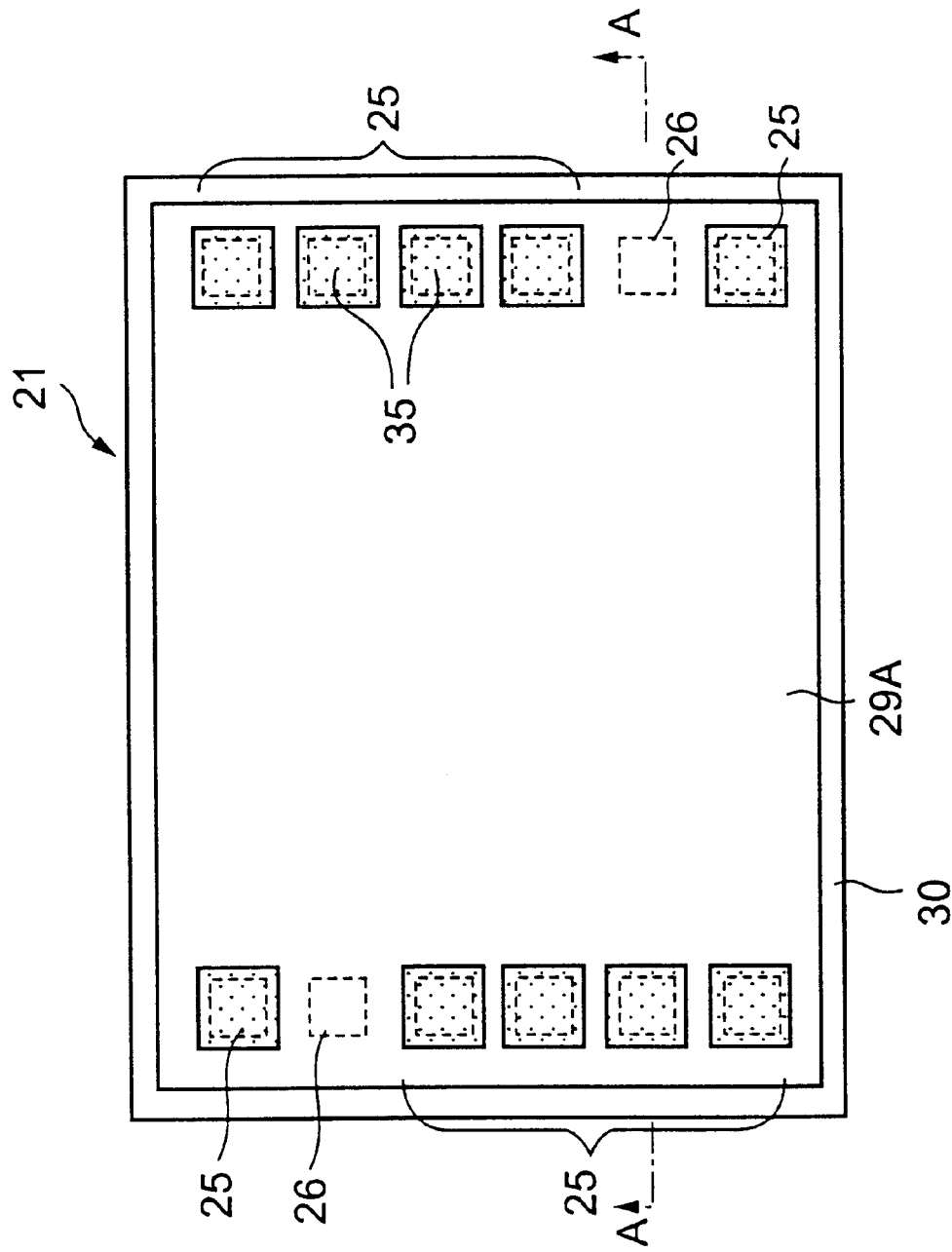
FIG. 5 is a plan view of the semiconductor substrate whose sectional view is shown in FIG. 4.

FIGS. 4 and 5 are diagrams for illustrating the steps of forming the first insulating film and forming the conductive metal film. FIG. 5 is a plan view of the semiconductor substrate 21 in a state where the steps of forming the first insulating film and forming the conductive metal film are completed. FIG. 4 is a sectional view of the semiconductor substrate 21 shown in FIG. 5 taken along the A—A line.

In producing the semiconductor device 20A, the step of forming the first insulating film is performed first to form the first insulating film 30 on the semiconductor substrate 21. As described above, the semiconductor substrate 21 is a semiconductor wafer on the upper surface of which electronic circuits are formed in advance in a separate process.

The signal pads 25, the ground pads 26 and the power supply pad (not shown) are formed on the periphery of a region where the electronic circuit is formed. The signal and ground pads 25 and 26 are made of aluminum (Al) having a good electrical characteristic.

Figure 10:
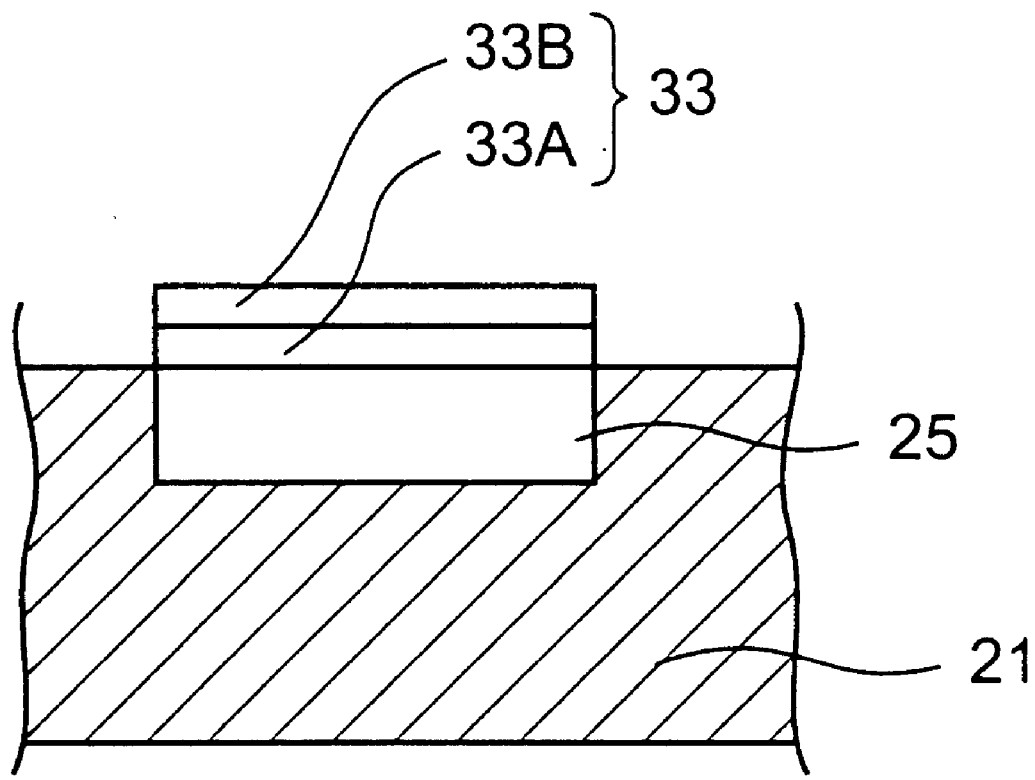
FIG. 10 is an enlarged fragmentary sectional view of the semiconductor substrate for illustrating a protective metal film formed on a signal pad.

Protective metal films 33 are formed on the surfaces of the signal pads 25 as shown in FIG. 10. According to this embodiment, each of the protective metal films 33 has a layered structure including a chromium (Cr) layer 33A and a copper (Cu) layer 33B each having a thickness of 0.5 $\mu$m. The protective metal films 33 each having the above-described structure protect the signal pads 25 in the below-described step of forming the interconnection lines.

The protective metal film 33 can be formed using, for example, electroplating, electroless plating or sputtering. Although the protective metal films 33 are formed only on the signal pads 25 according to this embodiment, the protective metal films 33 can be formed also on the ground pads 26.

The first insulating film 30 is an insulating resin such as polyimide, and is formed by spin coating or the like to have a thickness of approximately 10 $\mu$m. In forming the first insulating film 30, the opening portions 37A and 37B are formed over the positions where the ground and signal pads 26 and 25 are formed, respectively, by providing the spin coating with the above-mentioned positions being masked. In other words, the first insulating film 30 does not cover the positions where the signal and ground pads 25 and 26 are formed. The first insulating film 30 has a main function of protecting the electronic circuit-containing on the semiconductor substrate 21. Further, resists 35 are formed in and on the opening portions 37B facing the signal pads 25 so that each of the resists 35 has a predetermined height, which is equal to that of the metal film 29A formed in the following step.

When the step of forming the first insulating film is completed, the step of forming the conductive metal film is entered on. The metal film 29A is made of a metal having low electrical resistance such as copper (Cu), aluminum (Al) or chromium (Cr), and is formed by, for example, electroplating to have a thickness of approximately 30 $\mu$m.

As previously described, in the first insulating film 30, the resists 35 are formed on the positions facing the signal pads 25. Therefore, the metal film 29A is formed to cover almost the entire surface of the first insulating film 30 except for the positions where the signal pads 25 are formed. On the other hand, in the first insulating film 30, the opening portions 37A are formed in the positions facing the ground pads 26. Thus, the metal film 29A is formed to be directly electrically connected to the ground pads 26 via the opening portions 37A.

The method of forming the metal film 29A is not limited to the above-mentioned electroplating. For example, it is also possible to employ a method of attaching a thin copper or aluminum film having the above-mentioned predetermined thickness on the first insulating film 30.

When the formation of the metal film 29A is over, the resists 35 are removed.

Figure 6:
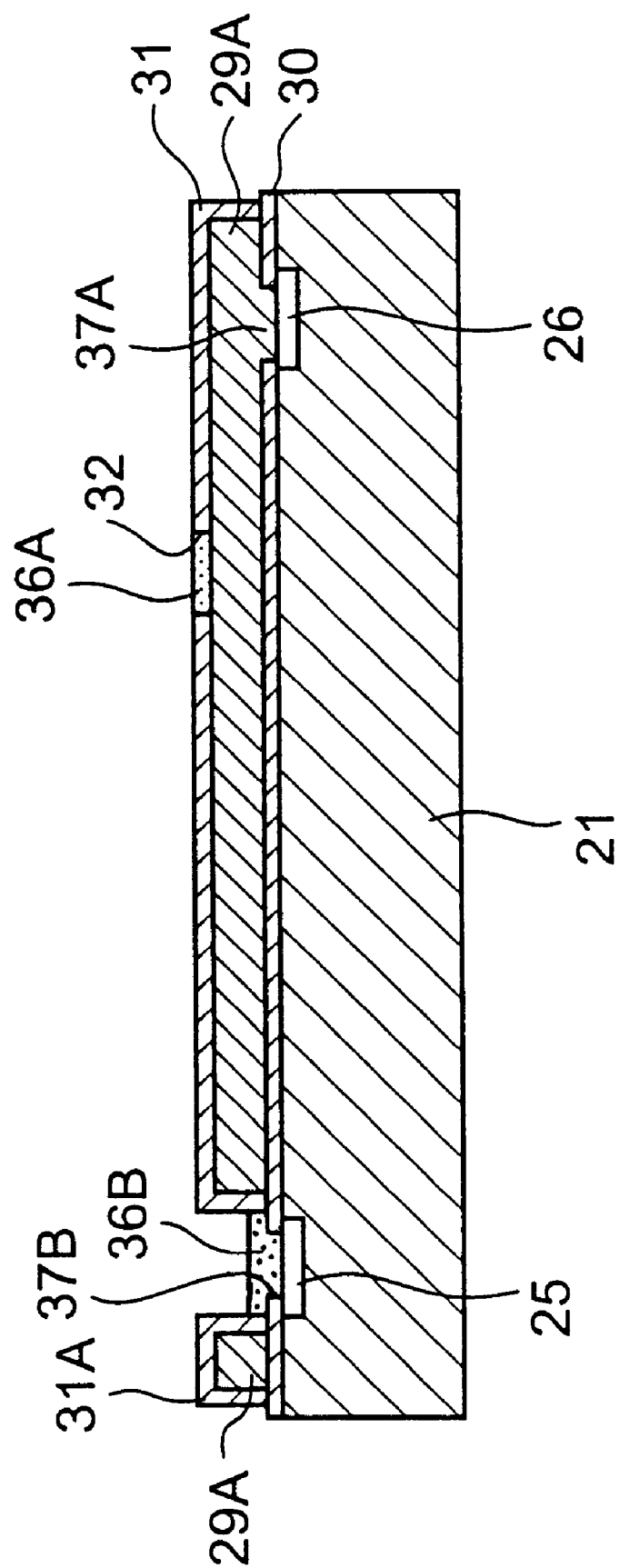
FIG. 6 is a sectional view of a semiconductor substrate of FIG. 7 taken along an A—A line for illustrating a step of forming a second insulating film, the step being included in the method of producing the semiconductor device according to the second embodiment of the present invention.
Figure 7:
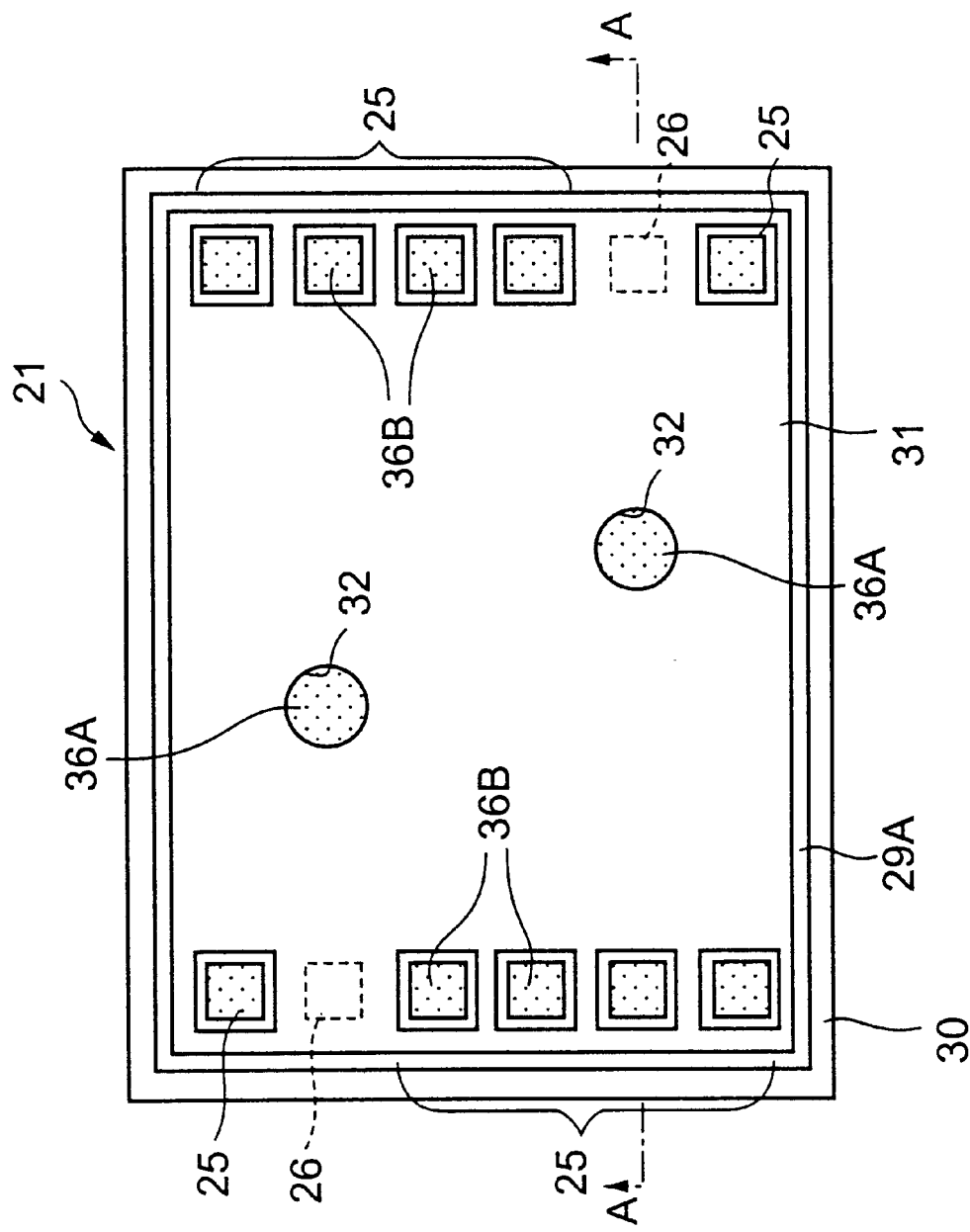
FIG. 7 is a plan view of the semiconductor substrate whose sectional view is shown in FIG. 6.

After the above-described steps of forming the first insulating film and forming the conductive metal film are completed, the step of forming the second insulating film is performed. FIGS. 6 and 7 are diagrams for illustrating the step of forming the second insulating film. FIG. 7 is a plan view of the semiconductor substrate 21 in a state where the step of forming the second insulating film is completed, and FIG. 6 is a sectional view of the semiconductor substrate 21 shown in FIG. 7 taken along the A—A line.

Like the above-described first insulating film 30, the second insulating film 31 is an insulating resin such as polyimide. The second insulating film 31 is formed by spin coating or the like to have a thickness of approximately 10 $\mu$m and cover the metal film 29A. In forming the second insulating film 31, resists 36A are formed in advance in the positions where the protrusion ground electrodes 23 are formed, and resists 36B are formed on the signal pads 25.

In other words, the second insulating film 31 does not cover the positions where the protrusion ground electrodes 23 and the signal pads 25 are formed. The second insulating film 31 has a main function of preventing a short circuit between the interconnection lines 28A and the metal film 29A.

Figure 8:
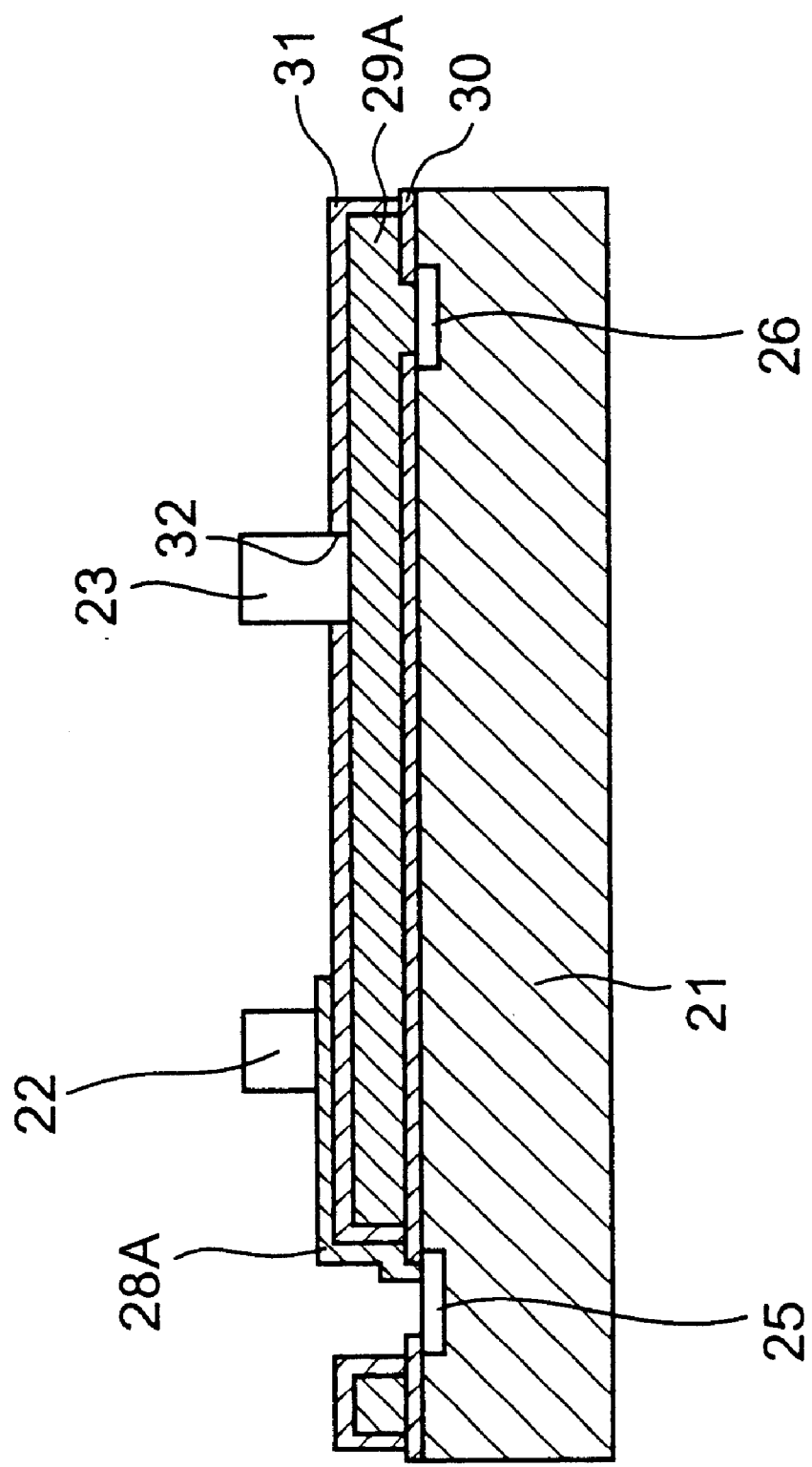
FIG. 8 is a sectional view of a semiconductor substrate of FIG. 9 taken along an A—A line for illustrating steps of forming interconnection lines and forming protrusion electrodes, the steps being included in the method of producing the semiconductor device according to the second embodiment of the present invention.
Figure 9:
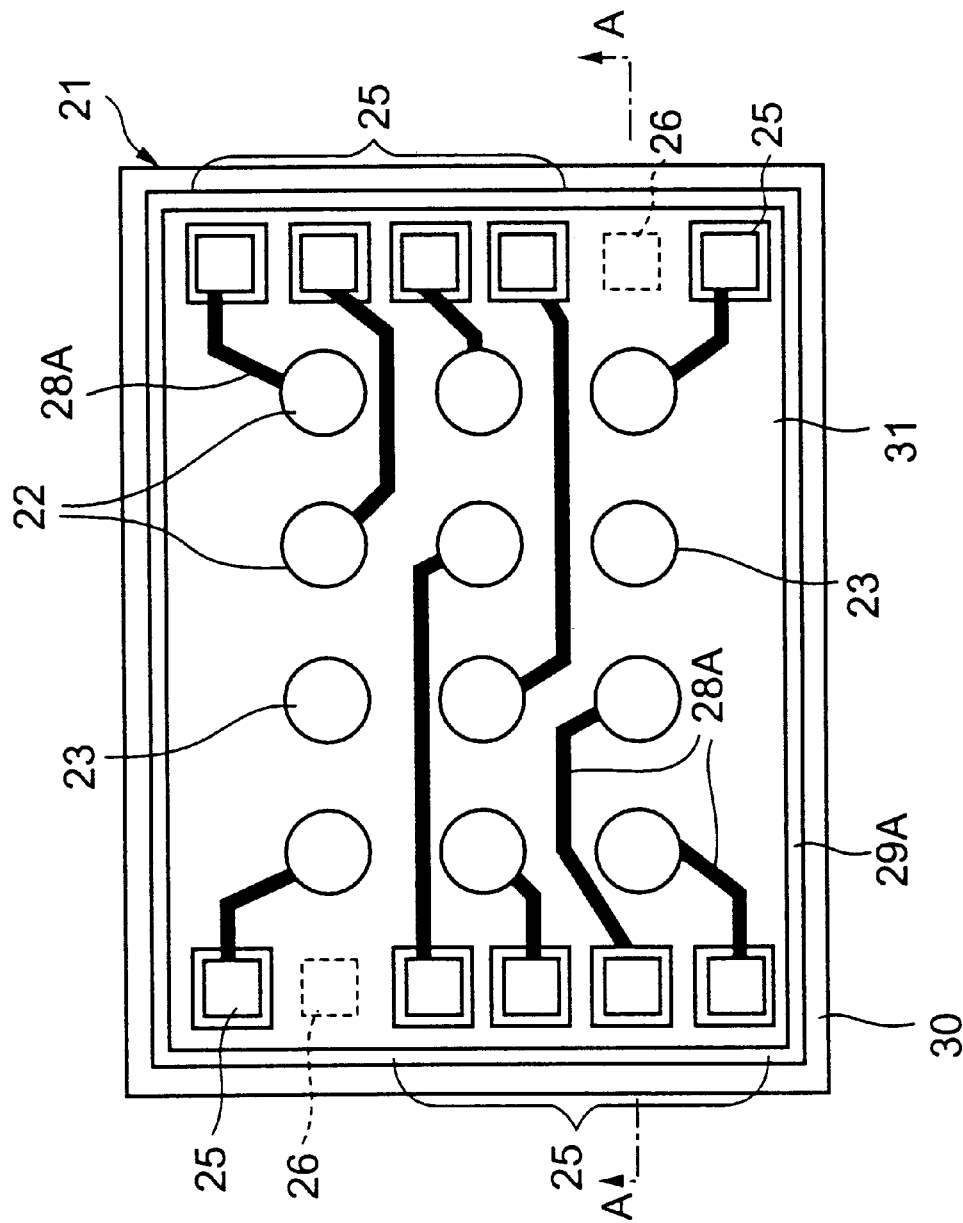
FIG. 9 is a plan view of the semiconductor substrate whose sectional view is shown in FIG. 8.

When the above-described step of forming the second insulating film is completed, the steps of forming the interconnection lines and forming the protrusion electrodes are performed in the order mentioned. FIGS. 8 and 9 are diagrams for illustrating the steps of forming the interconnection lines and forming the protrusion electrodes. FIG. 9 is a plan view of the semiconductor substrate 21 in a state where the steps of forming the interconnection lines and forming the protrusion electrodes are completed. FIG. 8 is a sectional view of the semiconductor substrate 21 shown in FIG. 9 taken along the A—A line.

In the step of forming the interconnection lines, the resists 36B formed on the signal pads 25 are removed, and a metal film to be formed into the interconnection lines 28A is formed over the entire surface of the second insulating film 31. This metal film can be made of a material such as copper (Cu) and formed by electroplating.

When the metal film is formed, a photosensitive resist is applied on the upper surface of the metal film, and an exposure process is performed only on the positions where the interconnection lines 28A are formed by using a mask. Then, the resist is removed from a region other than the positions where the interconnection lines 28A are formed, so that the metal film is provided with the resist only on the positions where the interconnection lines 28A are formed.

Next, the metal film is removed by etching from the region other than the positions where the interconnection lines 28A are formed, and the interconnection lines 28A are formed in a predetermined pattern by removing the residual resist. At this point, each of the first end portions of the interconnection lines 28A is electrically connected to the corresponding one of the signal pads 25.

As described above, the interconnection lines 28A are formed above the metal film 29A with the second insulating film 31 interposed therebetween. The metal film 29A, in a plan view of the semiconductor substrate 21, is formed over the region including a plurality of the interconnection lines 28A. That is, the metal film 29A and the interconnection lines 28A have the layered structure. Therefore, the metal film 29A and the interconnection lines 28A can be formed without being restricted by each other's positions, thus allowing the wide formation area for each of the metal film 29A and the interconnection lines 28A.

In the step of forming the interconnection lines, a plurality of chemical treatments such as the application and removal of the resist and the etching of the metal film are performed so as to form the interconnection lines 28A. On the other hand, the signal pads 25, which, in many cases, are made of a material sensitive to chemical treatment such as aluminum, are prone to be damaged in the step of forming the interconnection lines or in other steps.

However, according to this embodiment, the protective metal films 33, which are resistant to chemical treatment, are formed on the surface of the signal pads 25 (see FIG. 10). By thus forming the protective metal films 33 on the signal pads 25, the signal pads 25 are prevented from being damaged in the step of forming the interconnection lines, thus increasing the reliability of the semiconductor device 20A.

When the interconnection lines 28A are formed as described above, the step of forming the protrusion electrodes is entered on so as to form the protrusion signal and ground electrodes 22 and 23. The protrusion signal electrodes 22 are formed on the interconnection lines 28A formed in the step of forming the interconnection lines, and the protrusion ground electrodes 23 are formed, after removing the resists 36A, in the openings 32 formed in the second insulating film 31. The protrusion signal and ground electrodes 22 and 23 are formed by, for example, electroplating.

Each of the protrusion signal and ground electrodes 22 and 23 is formed to have a height of, for example, approximately 100 μm. The height is a distance from the circuit-containing surface of the semiconductor substrate 21 to the top end portion of each of the protrusion signal and ground electrodes 22 and 23. Since the protrusion ground electrodes 23 are formed directly on the metal film 29A through the openings 32 formed in the second insulating film 31, an impedance of the electrical connection between the protrusion ground electrodes 23 and the metal film 29A can be lowered.

After the above-described steps of forming the interconnection lines and forming the protrusion electrodes are completed, the step of providing the resin sealing is performed. In the step of providing the resin sealing, the semiconductor substrate 21 is attached to a mold for resin sealing and the sealing resin 24 is formed by compression molding. The sealing resin 24 is formed to cover the entire circuit-containing surface of the semiconductor substrate 21 so as to seal the interconnection lines 28A formed on the semiconductor substrate 21, the metal film 29A, the first and second insulating films 30 and 31, and the protrusion signal and ground electrodes 22 and 23.

However, the sealing resin 24 seals only the sides of the protrusion signal and ground electrodes 22 and 23, so that the top end portions thereof appear from the sealing resin 24. Although the sealing resin 24 is a thin resin film whose thickness ranges from 10 to 100 μm, the sealing resin 24 can be securely formed by employing compression molding.

When the above-described step of providing the resin sealing is over, the semiconductor substrate 21 in the wafer state is divided into the individual semiconductor devices 20A in a dicing process, thus forming the semiconductor device shown in FIG. 3. According to the above-described method of producing the semiconductor device 20A, the first insulating film 30 is formed on the semiconductor substrate 21, the metal film 29A is formed on the first insulating film 30, and the second insulating film 31 is formed on the metal film 29A before the interconnection lines 28A are formed on the second insulating film 31. Therefore, the semiconductor device 20A including the metal film 29A formed over the region including a plurality of the interconnection lines 28A can be formed easily.

Next, descriptions will be given, with reference to FIGS. 11 through 14, of semiconductor devices according to third through sixth embodiments of the present invention. In FIGS. 11 through 14, the same elements as those of the semiconductor device 20A of FIG. 3 according to the first embodiment of the present invention are referred to by the same numerals, and a description thereof will be omitted.

Figure 11:
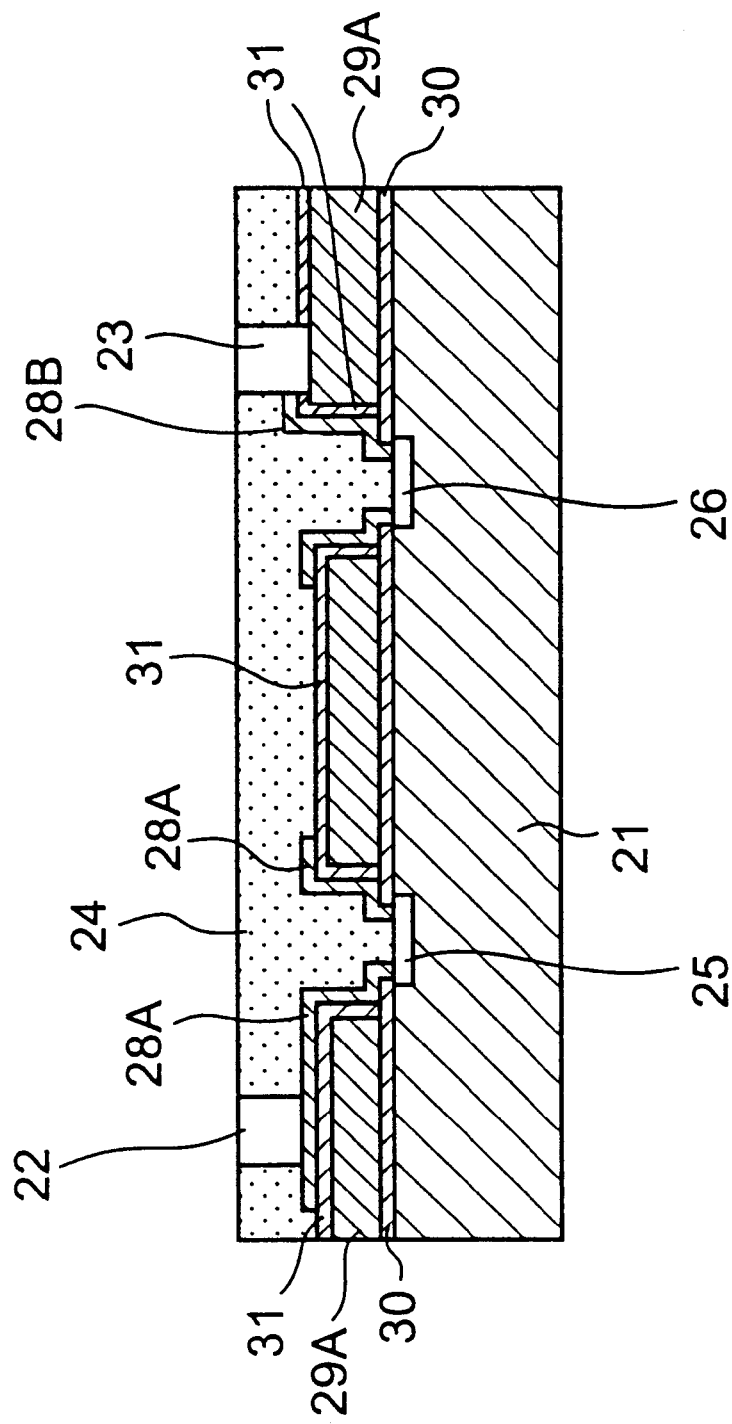
FIG. 11 is a sectional view of a semiconductor device according to a third embodiment of the present invention.

FIG. 11 is a sectional view of a semiconductor device 20B according to the third embodiment of the present invention.

According to the semiconductor device 20A of the above-described first embodiment, the protrusion ground electrodes 23 are directly connected to the metal film 29A, and the ground pads 26 also are directly connected to the metal film 29A so as to electrically connect the protrusion ground electrodes 23 and the ground pads 26.

However, according to the semiconductor device 20A, for example, it may be difficult to directly connect the ground pads 26 and the metal film 29A because of the dense layout of a large number of the signal and ground pads 25 and 26. In order to solve such a problem, according to the semiconductor device 20B of this embodiment, the protrusion ground electrodes 23 formed on the metal film 29A and the ground pads 26 are connected by interconnection lines for ground (hereinafter, ground interconnection lines) 28B.

By thus connecting the protrusion ground electrodes 23 formed on the metal film 29A and the ground pads 26 by the ground interconnection lines 28B, the semiconductor device 20B including the metal film 29A formed over a region including a plurality of the interconnection lines 28A and the ground interconnection lines 28B can be formed easily even in the case of a complicated pad layout. Further, in the above-described step of forming the interconnection lines, the ground interconnection lines 28B can be formed simultaneously with the interconnection lines 28A connecting the signal pads and the protrusion signal electrodes 22.

Therefore, the production process of the semiconductor device 20B is not complicated by forming the ground interconnection lines 28B.

Figure 12:
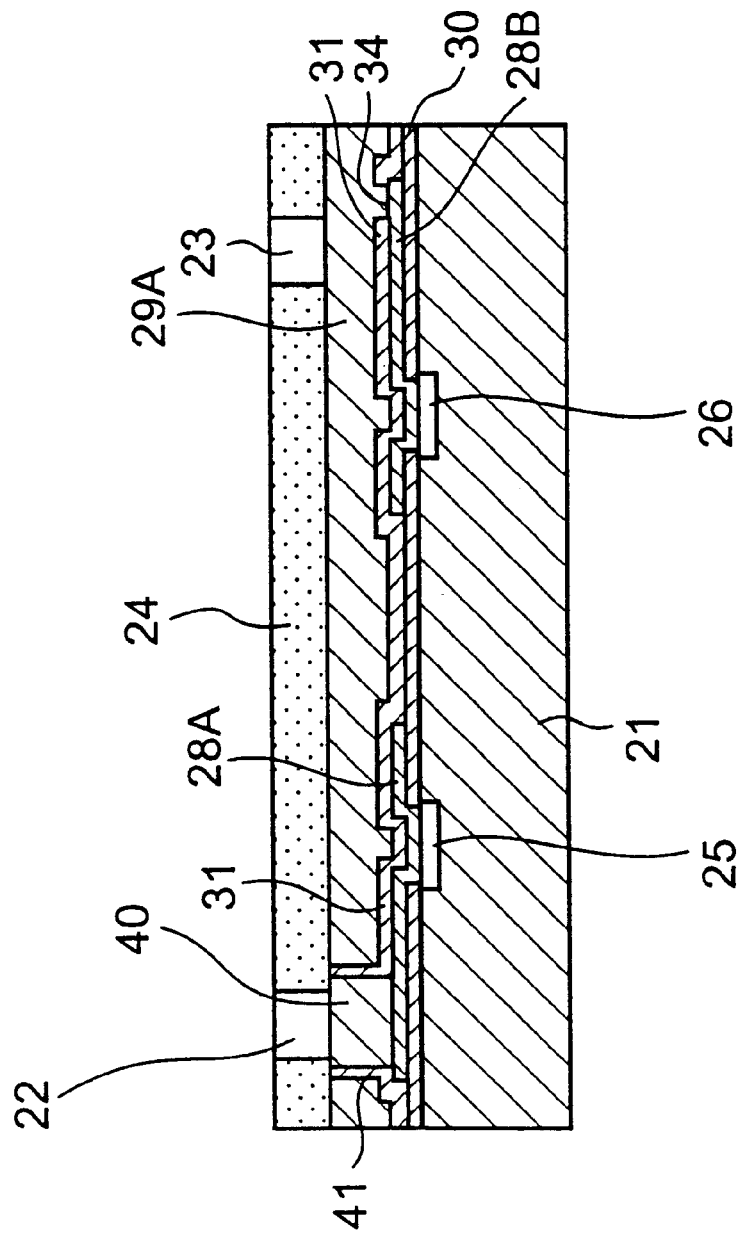
FIG. 12 is a sectional view of a semiconductor device according to a fourth embodiment of the present invention.

FIG. 12 is a sectional view of a semiconductor device 20C according to the fourth embodiment of the present invention.

According to the above-described semiconductor device 20A of the first embodiment, the interconnection lines 28A formed above the metal film 29A are employed to connect the protrusion signal electrodes 22 and the signal pads 25.

However, the interconnection lines 28A are not limited to being formed above the metal film 29A.

According to this embodiment, the interconnection lines 28A and the ground interconnection lines 28B are formed below the metal film 29A.

In order to have the above-described structure, metal films for signal connection (hereinafter signal connection metal films) 40 are formed in the positions where the protrusion signal electrodes 22 are formed when the metal film 29A is formed in the above-described step of forming the conductive metal film. The signal connection metal films 40 are electrically insulated from the metal film 29A by the second insulating film 31 and a third insulating film 41. Further, the protrusion signal electrodes 22 are formed on the upper end portions of the signal connection metal films 40, while the lower end portions thereof are connected to the interconnection lines 28A connected to the signal pads 25. Thus, the protrusion signal electrodes 22 and the signal pads 25 are electrically connected via the interconnection lines 28A and the signal connection metal films 40.

The metal film 29A is electrically connected to the ground interconnection lines 28B via openings 34 formed in the second insulating film 31.

Figure 13:
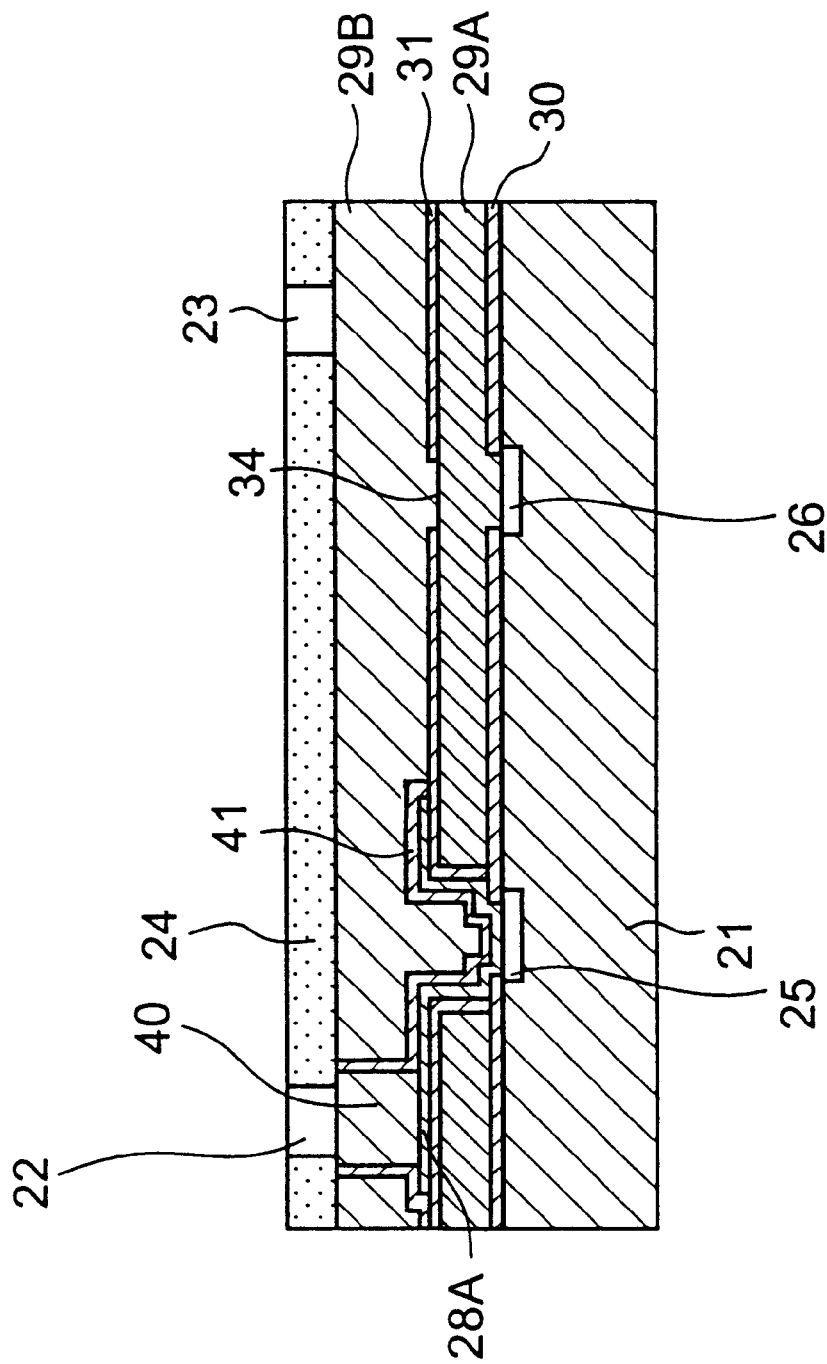
FIG. 13 is a sectional view of a semiconductor device according to a fifth embodiment of the present invention.

FIG. 13 is a sectional view of a semiconductor device 20D according to the fifth embodiment of the present invention.

The semiconductor devices 20A through 20C of the above-described embodiments each include only one metal film 29A. On the other hand, the semiconductor device 20D according to this embodiment includes a plurality of (two in this embodiment) metal films, namely, the metal film 29A and a metal film 29B. For the convenience of a description, the metal films 29A and 29B are hereinafter referred to as a first metal film 29A and a second metal film 29B, respectively.

The second metal film 29B is formed above the first metal film 29A with the second insulating film 31 interposed therebetween. In order to form the first and second metal films 29A and 29B in layers, the above-described steps of forming the first insulating film, forming the conductive metal film, forming the second insulating film and forming the interconnection lines are repeated a plurality of times before the above-described step of forming the protrusion electrodes. This allows the first and second metal films 29A and 29B to be formed in multiple layers with ease. The first and second metal films 29A and 29B are electrically connected via the openings 34.

Further, according to the semiconductor device 20D of this embodiment, the interconnection lines 28A formed above the first metal film 29A and the signal connection metal films 40 are employed to connect the protrusion signal electrodes 22 and the signal pads 25. In order to have this structure, the signal connection metal films 40 are formed in the positions where the protrusion signal electrodes 22 are formed when the second metal film 29B is formed in the above-described step of forming the conductive metal film. The signal connection metal films 40 are electrically insulated from the metal film 29A by the second and third insulating films 31 and 41. Further, the protrusion signal electrodes 22 are formed on the upper end portions of the signal connection metal films 40, while the lower end portions thereof are connected to the interconnection lines 28A connected to the signal pads 25. Thus, the protrusion signal electrodes 22 and the signal pads 25 are electrically connected via the interconnection lines 28A and the signal connection metal films 40.

FIG. 14 is a plan view of a semiconductor device 20E according to the sixth embodiment of the present invention. In FIG. 14, the sealing resin 24 is removed from the semiconductor device 20E.

According to the above-described embodiments, the interconnection lines 28A and the ground interconnection lines 28B are formed above or below the first metal film 29A or the second metal film 29B. On the other hand, according to the semiconductor device 20E of this embodiment, the interconnection lines 28A and a metal film 29C are formed on the same flat surface. In this structure, the interconnection lines 28A and the metal film 29C are electrically insulated.

According to this embodiment, the interconnection lines 28A and the metal film 29C can be formed in the same step, thus allowing the production process of the semiconductor device 20E to be simplified. Further, the metal film 29C is formed on the semiconductor substrate 21 except for positions of the protrusion signal and ground electrodes 22 and 23, the signal and ground pads 25 and 26 and the interconnection lines 28A. Therefore, an impedance of the metal film 29C can be reduced, so that the electrical characteristic of the semiconductor device 20E can be improved.

The present invention is not limited to the specifically disclosed embodiments, and variations and modifications may be made without departing from the scope of the present invention.

The present application is based on Japanese priority application No. 2000-078935 filed on Mar. 21, 2000, the entire contents of which are hereby incorporated by reference.

What is claimed is:

1. A semiconductor device comprising:
   a semiconductor substrate including a plurality of signal pads and ground pads;
   an insulating film formed on said semiconductor substrate;
   a conductive metal film formed on said insulating film and electrically connected to said ground pads; and
   a plurality of first interconnection lines electrically connected to said signal pads and insulated from said conductive metal film,
   wherein said conductive metal film is formed over a region including said first interconnection lines in a plan view of the semiconductor device.

2. The semiconductor device as claimed in claim 1, further comprising:
   a plurality of first protrusion electrodes electrically connected to said first interconnection lines;
   a plurality of second protrusion electrodes electrically connected to and formed directly on said conductive metal film; and
   a sealing resin sealing said signal and ground pads, said insulating film, said conductive metal film, said first interconnection lines and sides. of said first and second protrusion electrodes.

3. The semiconductor device as claimed in claim 1, wherein said ground pads are connected directly to said conductive metal film.

4. The semiconductor device as claimed in claim 1, further comprising protective metal films formed on said signal pads.

5. The semiconductor device as claimed in claim 1, further comprising protective metal films formed on said ground pads.

6. The semiconductor device as claimed in claim 1, wherein said first interconnection lines are formed above said conductive metal film.

7. The semiconductor device as claimed in claim 2, further comprising a plurality of second interconnection lines electrically connecting said ground pads and said second protrusion electrodes, said second interconnection lines being included in the region.

8. The semiconductor device as claimed in claim 7, wherein said second interconnection lines are formed above said conductive metal film.

9. A semiconductor device comprising:
   a semiconductor substrate including a plurality of signal pads and ground pads;
   an insulating film formed on said semiconductor substrate;
   a conductive metal film electrically connected to said ground pads;
   a plurality of first interconnection lines electrically connected to said signal pads and insulated from said conductive metal film; and
   a plurality of metal films electrically connected to said first interconnection lines and insulated from said conductive metal film,
   wherein said conductive metal film is formed over a region including said first interconnection lines in a plan view of the semiconductor device.

10. The semiconductor device as claimed in claim 9, further comprising:
    a plurality of first protrusion electrodes electrically connected to said metal films;
    a plurality of second protrusion electrodes electrically connected to and formed directly on said conductive metal film; and
    a sealing resin sealing said signal and ground pads, said insulating film, said conductive metal film, said first interconnection lines, said metal films and sides of said first and second protrusion electrodes.

11. The semiconductor device as claimed in claim 9, wherein said first interconnection lines are formed below said conductive metal film.

12. The semiconductor device as claimed in claim 9, further comprising a plurality of second interconnection lines electrically connecting said ground pads and said conductive metal film, said second interconnection lines being included in the region.

13. The semiconductor device as claimed in claim 12, wherein said second interconnection lines are formed below said conductive metal film.

14. A semiconductor device comprising:
    a semiconductor substrate including a plurality of signal pads and ground pads;
    an insulating film formed on said semiconductor substrate;
    a first conductive metal film formed on said insulating film and electrically connected to said ground pads;
    a second conductive metal film electrically connected to and formed on said first conductive metal film; and
    a plurality of interconnection lines electrically connected to said signal pads and insulated from said first and second conductive metal films,
    wherein said first and second conductive metal films are formed over a region including said interconnection lines in a plan view of the semiconductor device.

15. The semiconductor device as claimed in claim 14, further comprising:
    a plurality of first protrusion electrodes;
    a plurality of second protrusion electrodes electrically connected to and formed directly on said second conductive metal film;
    a plurality of metal films electrically connecting said interconnection lines and said first protrusion electrodes, said metal films being insulated from said first and second conductive metal films; and
    a sealing resin sealing said signal and ground pads, said insulating film, said first and second conductive metal films, said interconnection lines, said metal films and sides of said first and second protrusion electrodes.

16. A method of producing a semiconductor device comprising the steps of:
    (a) forming a first insulating film on a semiconductor substrate including signal and ground pads except for positions where said signal and ground pads are formed;
    (b) forming a conductive metal film on said first insulating film except for the positions where said signal pads are formed;
    (c) forming a second insulating film over said conductive metal film;
    (d) forming interconnection lines on said second insulating film;
    (e) forming protrusion electrodes each having a predetermined height on said interconnection lines; and
    (f) providing resin sealing on said first and second insulating films, said conductive metal film, said interconnection lines and sides of said protrusion electrodes.

17. The method of producing the semiconductor device as claimed in claim 16, wherein said steps (a) through (d) are repeated a plurality of times before said step (e) so that said conductive metal film is formed in multiple layers.

* * * * *